US011544225B2

(12) United States Patent
McElveen

(10) Patent No.: US 11,544,225 B2
(45) Date of Patent: *Jan. 3, 2023

(54) METHOD AND SYSTEM FOR CONTENT AGNOSTIC FILE INDEXING

(71) Applicant: LOGNOVATIONS HOLDINGS, LLC, Tampa, FL (US)

(72) Inventor: Christopher A. McElveen, Tampa, FL (US)

(73) Assignee: LOGNOVATIONS HOLDINGS, LLC, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/183,178

(22) Filed: Feb. 23, 2021

(65) Prior Publication Data

US 2021/0173816 A1 Jun. 10, 2021

Related U.S. Application Data

(63) Continuation of application No. 15/730,043, filed on Oct. 11, 2017, now Pat. No. 10,963,429.

(51) Int. Cl.
*G06F 7/02* (2006.01)
*G06F 16/00* (2019.01)
*G06F 16/174* (2019.01)
*G06F 16/13* (2019.01)
*G06F 16/22* (2019.01)

(52) U.S. Cl.
CPC ......... *G06F 16/1744* (2019.01); *G06F 16/13* (2019.01); *G06F 16/2237* (2019.01)

(58) Field of Classification Search
CPC ....... H04L 9/065; H04L 69/04; H04L 9/0631; G06F 16/2237; G06F 16/2282; G06F 16/13; G06F 16/1744; H03M 7/30; H03M 7/60; H03M 7/55
See application file for complete search history.

(56) References Cited

U.S. PATENT DOCUMENTS

| | | | | |
|---|---|---|---|---|
| 5,673,042 | A * | 9/1997 | Yoshida | ............ G06F 16/90344 341/51 |
| 9,374,220 | B2 * | 6/2016 | Youn | ....................... H04L 9/008 |
| 10,135,462 | B1 * | 11/2018 | Wallace | .............. G06F 11/1453 |
| 2006/0244639 | A1 * | 11/2006 | Parker | ..................... H03M 7/40 341/51 |
| 2019/0191372 | A1 * | 6/2019 | Murali | .................... H04L 27/06 |
| 2020/0211677 | A1 * | 7/2020 | Fan | ........................ G16B 30/00 |

OTHER PUBLICATIONS

"The Enduring Challenge of Compressing Random Data," Mark Nelson and Guest Editor, Dr. Dobbs World of Software Development, drdobbs.com Nov. 6, 2012, retrieved on Mar. 25, 2022. (Year: 2012).*

* cited by examiner

*Primary Examiner* — Bruce M Moser
(74) *Attorney, Agent, or Firm* — Brian J. Colandreo; Heath M. Sargeant; Holland & Knight LLP

(57) ABSTRACT

A computer-implemented method for content-agnostic referencing of a binary data file, the method comprising: determining a length of the binary data file, the length comprising the number of bits of the binary data file; for the determined length, generating all permutations of data of the determined length; locating an index within the generated permutations, wherein the index is the starting position of the binary data file within the generated permutations; and using the length and the index to indicate the binary data file.

20 Claims, 2 Drawing Sheets

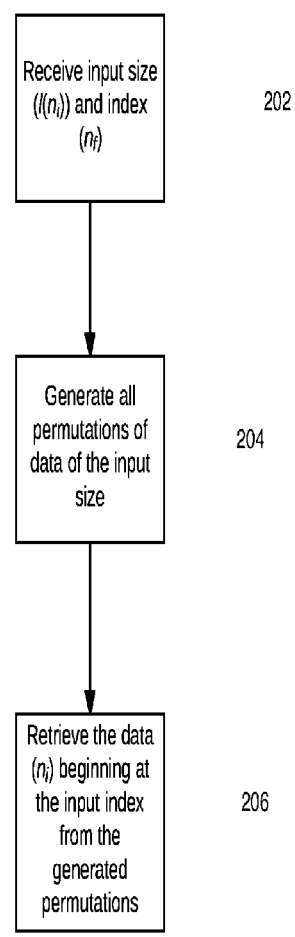

METHOD AND SYSTEM FOR CONTENT AGNOSTIC FILE INDEXING

CROSS-REFERENCE TO RELATED APPLICATIONS

This application is a continuation of U.S. patent application Ser. No. 15/730,043, filed on Oct. 1, 2017, entitled "Method and System for Content Agnostic File Indexing," which is hereby incorporated by reference herein in its entirety, including all references and appendices cited therein for all purposes.

TECHNICAL FIELD

This disclosure relates to a method for content agnostic file referencing. The method may further relate to a method for content agnostic data compression.

BACKGROUND OF THE INVENTION

File referencing techniques generally require knowledge about the kind of data being stored in order to efficiently index the data in a file referencing system. Similarly, knowledge about the data at issue is also generally used in creating improved compression approaches to reduce data size for transmission, storage, and the like.

There exists a need in the industry to improve file referencing and data compression techniques to reduce the amount of data that must be stored and/or transmitted.

SUMMARY OF THE INVENTION

According to one embodiment, this disclosure provides a method for improving computing technology with an enhanced content-agnostic file referencing system.

The disclosed method has several important advantages. For example, the disclosed method permits file referencing of any content type.

The disclosed method additionally permits a significant reduction in the amount of information or data that must be persisted or transmitted, as data may be generated at access time as opposed to persisted.

Various embodiments of the present disclosure may have none, some, or all of these advantages. Other technical advantages of the present disclosure may also be readily apparent to one skilled in the art.

BRIEF DESCRIPTION OF THE DRAWINGS

For a more complete understanding of the present disclosure and its advantages, reference is now made to the following descriptions, taken in conjunction with the accompanying drawings, in which:

FIG. 2 is another flowchart outlining the steps of another embodiment of the present disclosure.

Similar reference numerals refer to similar parts or steps throughout the several views of the drawings.

DETAILED DESCRIPTION OF THE EMBODIMENTS

Figure 1:
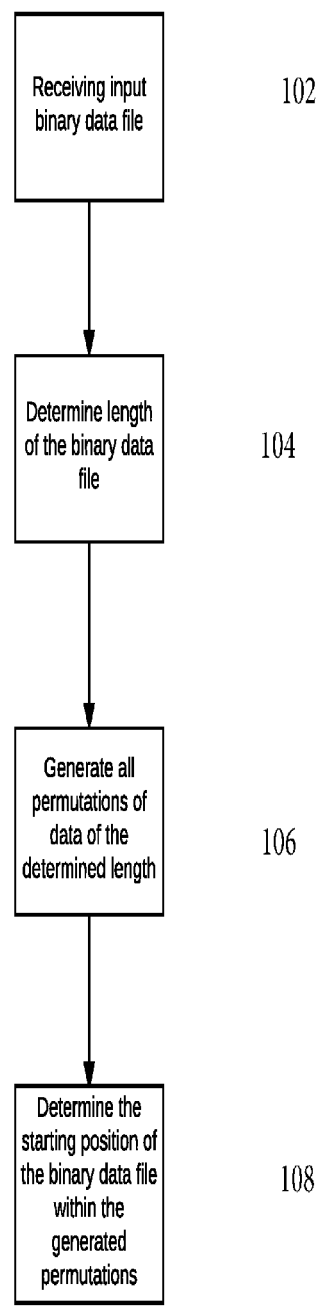
FIG. 1 is a flowchart outlining the steps of one embodiment of the present disclosure.

The present disclosure relates to a method for content-agnostic indexing of data. The method may be used for a variety of computer-specific needs, including for example as a file referencing system or a compression system.

The disclosure below describes the invention in connection with compression of binary data as exemplary, but the teachings work as well with any type of data, better termed "n-ary" data. For example, the method and system also works with qubits and bits.

One embodiment of the present invention comprises a method as described in the flow chart depicted in FIG. 1. Binary data (m) (for instance, a data file) to be persisted or transmitted is analyzed to determine its length in bits ($1(m)$). Using this information, at step 106, the method calculates all permutations of data of the identified length. For example, if the input data is:

01 then the input data is 2-bits long. At step 106, all permutations of 2-bits will be generated, namely:

{00} {01} {10} {11}

At step 108, the method determines the index ($n_f$) of the input binary data file in the generated permutations. Using the example above, the index ($n_f$) returned would be "1". Finally, rather than storing or transmitting the input binary data (i.e. "01"), the system instead stores the length (2) and the index (1).

When the need comes to decode the original input data (for instance, a request to retrieve the original binary data from disk, or receipt of the transmitted data across a network), the method needs only a length ($l(n_i)$) and an index ($n_f$) as input. Using the above example, the input provided would be the length (2) and the index (1). As shown in FIG. 2, the system calculates all permutations of the inputted length. As above, that would generate the following permutations:

{00} {01} {10} {11}

The system would then go to the provided index (1 in the above example) and return the permutation. Again, using the above example, this would return "01" the original binary data.

The above method has been described for purposes of example in terms of a binary system (i.e. the input data is binary data). The method and system work similarly for n-ary systems. While the binary system describes above works essentially in the Euclidean plane, with n-ary data Hilbert spaces conceptually provide the same advantages. The method and process can be generalized for n-ary data per below:

$$d^\wedge n = p(i)$$

$$(d^\wedge n)n = p(f)$$

d=order of the system
n=length in appropriate n-ary units respective to the order of the system
p(i)=initial index
p(f)=final index

| Order of System (d) | Visual Representation | Reference Key | Search Pattern |
|---|---|---|---|
| 1 | String | n/x | Left to Right |
| 2 | Plane | n/x/y | Top Left to Bottom Right |
| 3 | 3(fold) | n/x/y/z | Top Back Left to Bottom Front Right |
| D | D(fold) | n/x/y/z/... | Top Back Left ... to Bottom Front Right ... |

It should be noted that given two alternative ordered systems with the same input file, the system with the higher order will have a higher n-ary density relative to the alternative with a lesser ordered system.

An example of the method is disclosed in the following Ruby code snippets. The below snippet demonstrates a method as disclosed in FIG. 1:

```
class Input
    require 'securerandom'
    def create(k)
        input_binary = SecureRandom.hex(k)
    end
    def clean(k)
        input_string = create(k).unpack('B*').first.to_s
    end
    def build(n)
        permutation = (0..2**n-1).map { |i| "%0#{n}b" % i }
    end
    def self.kmp_search(string, substring)
        return nil if string.nil? or substring.nil?
        pos = 2
        cnd = 0
        failure_table = [-1, 0]
        while pos < substring.length
            if substring[pos - 1] == substring[cnd]
                failure_table[pos] = cnd + 1
                pos += 1
                cnd += 1
            elsif cnd > 0
                cnd = failure_table[cnd]
            else
                failure_table[pos] = 0
                pos += 1
            end
        end
        m = i = 0
        while m + i < string.length
            if substring[i] == string[m + i]
                i += 1
                return m if i == substring.length
            else
                m = m + i - failure_table[i]
                i = failure_table[i] if i > 0
            end
        end
        return nil
    end
    def kmp_search(substring)
        Input.kmp_search(self, substring)
    end
end
init        = Input.new
input       = init.clean(1)
depth       = input.length
generate         = init.build(depth)
steps       = generate.join.to_s
step        = Input.kmp_search("#{steps}","#{input}")
p input
p depth
p step
```

The below snippet demonstrates a method as disclosed in FIG. 2, using an input length ($l(n_i)$) of 16 and an index ($n_j$) of 72,629:

```
class Output
    def build(n)
        permutation = (0..2**n-1).map { |i| "%0#{n}b" % i }
    end
end
depth       = 16
step        = 72629
init        = Output.new
create      = init.build(depth)
interpret   = create.join.to_s
compute          = (depth + step) - 1
output           = interpret[step..compute].gsub(/\s\w+$/,'...')
p output
```

The method and system may preferably be implemented in a computing system, which can include a personal computer, a workstation, a network computer, a hand held computer, or any other computing system. Further, the system may be written as a software program in any appropriate computer language.

The system includes one or more processing devices, which may be any computer processing unit, and could be a single central processing unit, or a number of processing units configured to operate either in sequence or in parallel. The processing device can be configured to execute software processes which implement the steps disclosed herein. The system may also include a memory capable of storing the steps necessary for a processing device to implement the steps disclosed herein. This memory could be in the form of memory resident within the processing device or in the form of standalone memory coupled to the processing unit via a communication path, such as a bus or a network.

Although this disclosure has been described in terms of certain embodiments and generally associated methods, alterations and permutations of these embodiments and methods will be apparent to those skilled in the art. Accordingly, the above description of example embodiments does not constrain this disclosure. Other changes, substitutions, and alterations are also possible without departing from the spirit and scope of this disclosure.

What is claimed is:

1. A content-agnostic referencing system of a binary data file, the system comprising:
   a processor; and
   a memory communicatively coupled to the processor, the memory storing instructions executable by the processor to perform a method comprising:
      determining an input size length of the binary data file, the input size length comprising the total number of bits of the binary data file;
      converting the determined input size length into a binary string;
      based on the determined input size length of the binary data file, generating all permutations of data of the determined input size length in a predetermined order;
      generating a table, based on the permutations of data of the determined input size length in the predetermined order;
      locating the binary string in the table;
      determining an index of the binary data file in the generated permutations of data, based on the located binary string;
      storing the input size length and the index in the memory;
      upon receiving a request for input binary data of the binary data file and using the input size length and the index, locating the index within the generated permutations of data, wherein the index is the starting position of the binary data file within the generated permutations, such that the located input binary data may be generated at access time; and
      providing the located input binary data in response to the request.

2. The system of claim 1, wherein the input size length and the index persist on the memory, instead of the binary data file.

3. The system of claim 1, wherein using the input size length and the index comprises:
   transmitting the input size length and the input size index to a recipient instead of the data file.

4. The system of claim 3, wherein transmitting transmits the input size length and index on a network.

5. The system of claim 3, wherein transmitting transmits the input size length and index on a bus.

6. A system for compressing a data file having a sequence of bytes, the system comprising:
a processor; and
a memory communicatively coupled to the processor, the memory storing instructions executable by the processor to perform a method comprising:
determining an input size length of the data file, the input size length comprising the total number of bytes in the data file;
converting the input size length into a binary string;
based on the determined input size length of the data file, generating, in a predetermined order, all possible permutations of data of the determined input size length of the number of bytes using the computer processor;
generating a table, based on the permutations of data of the determined input size length in the predetermined order;
locating the binary string in the table;
searching through the generated permutations to locate the permutation that matches the data file;
determining an index of the located permutation in the generated permutations of data, based on the located binary string;
storing the input size length and index in the memory;
upon receiving a request for input data of the data file and using the input size length and the index, locating the index within the generated permutations of data, via the computer processor, wherein the index is the starting position of the data file within the generated permutations, such that the input data may be generated at access time; and
providing the input data in response to the request.

7. The system of claim 6, wherein the input size length and the index persist on the memory, instead of the data file.

8. The system of claim 7, wherein the memory is a disk.

9. The system of claim 8, wherein using the number of bytes and the input size index to indicate the data file comprises transmitting the number of bytes and the input size index to a recipient instead of the data file.

10. The system of claim 9, wherein transmitting transmits the bytes and the input size index over a network.

11. The system of claim 9, wherein transmitting transmits the bytes and the input size index via a bus.

12. A system for compressing a data file, comprising:
a processor; and
a memory communicatively coupled to the processor, the memory storing instructions executable by the processor to perform a method comprising:
determining the size of the data file, the size comprising the total number of bits of the data file;
converting the determined size length of the data file into a binary string;
based on the determined size of the data file, generating, in a predetermined order, all possible permutations of data of the determined size length of the data file;
generating a table, based on the permutations of data of the determined size length in the predetermined order;
locating the binary string in the table;
searching through the generated permutations to locate the permutation that matches the data file;
determining the index of the located permutation;
storing the size and the index of the located permutation in the memory;
upon receiving a request for input data of the data file and using the size and the index of the located permutation, locating the index within the generated permutations of data, wherein the index is the starting position of the data file within the generated permutations, such that the located input data may be generated at access time; and
providing the located input data in response to the request.

13. The system of claim 12 where the data file is binary data.

14. The system of claim 12 where the data file is n-ary data.

15. The system of claim 12 where the index is an integer.

16. The system of claim 12, wherein using the size and the input size index comprises;
transmitting the size and the input size index to a recipient.

17. The system of claim 16, wherein transmitting comprises transmitting on a network.

18. The system of claim 16, wherein transmitting comprises transmitting on a bus.

19. The system of claim 12, wherein using the size and the input size index comprises;
storing the size and the input size index.

20. A computer-implemented method for content-agnostic referencing of a binary data file, the method comprising:
determining, by a computer processor, an input size length of the binary data file, the input size length comprising the total number of bits of the binary data file;
converting the input size length into a binary string;
generating, by the computer processor, all permutations of data of the determined input size length in order;
generating a table, based on the permutations of data;
locating the binary string in the table;
determining an index of the binary data file in the generated permutations of data, based on the located binary string;
storing the input size length and the index, in a memory coupled to the computer processor;
upon receiving a request for input binary data, locating the index within the generated permutations of data, wherein the index is the starting position of the binary data file within the generated permutations; and
providing the located input binary data in response to the request.

* * * * *